(12) United States Patent
Lu et al.

(10) Patent No.: US 11,887,645 B2
(45) Date of Patent: Jan. 30, 2024

(54) DUAL-PRECISION ANALOG MEMORY CELL AND ARRAY

(71) Applicant: HEFEI RELIANCE MEMORY LIMITED, Hefei (CN)

(72) Inventors: Zhichao Lu, San Jose, CA (US); Liang Zhao, Sunnyvale, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

(21) Appl. No.: 18/082,005

(22) Filed: Dec. 15, 2022

(65) Prior Publication Data

US 2023/0118667 A1 Apr. 20, 2023

Related U.S. Application Data

(63) Continuation of application No. 17/308,675, filed on May 5, 2021, now Pat. No. 11,551,739, which is a
(Continued)

(51) Int. Cl.
*G11C 14/00* (2006.01)
*G11C 11/22* (2006.01)
(Continued)

(52) U.S. Cl.
CPC ............ *G11C 11/2273* (2013.01); *G06N 3/06* (2013.01); *G06N 5/04* (2013.01); *G11C 11/2255* (2013.01);
(Continued)

(58) Field of Classification Search
CPC .................................................. G11C 14/0027
(Continued)

(56) References Cited

U.S. PATENT DOCUMENTS

| 5,621,336 A | 4/1997 | Shibata et al. |
| 7,368,789 B1 | 5/2008 | Dhaoui et al. |

(Continued)

OTHER PUBLICATIONS

PCT International Search Report and the Written Opinion dated Jan. 30, 2020, issued in related International Application No. PCT/US2019/062895 (7 pages).
(Continued)

*Primary Examiner* — Hoai V Ho
(74) *Attorney, Agent, or Firm* — Sheppard Mullin Richter & Hampton LLP

(57) ABSTRACT

Dual-precision analog memory cells and arrays are provided. In some embodiments, a memory cell, comprises a non-volatile memory element having an input terminal and at least one output terminal; and a volatile memory element having a plurality of input terminals and an output terminal, wherein the output terminal of the volatile memory element is coupled to the input terminal of the non-volatile memory element, and wherein the volatile memory element comprises: a first transistor coupled between a first supply and a common node, and a second transistor coupled between a second supply and the common node; wherein the common node is coupled to the output terminal of the volatile memory element; and wherein gates of the first and second transistors are coupled to respective ones of the plurality of input terminals of the volatile memory element.

12 Claims, 9 Drawing Sheets

Related U.S. Application Data continuation of application No. 16/693,332, filed on Nov. 24, 2019, now Pat. No. 11,069,391.

(60) Provisional application No. 62/773,991, filed on Nov. 30, 2018.

(51) Int. Cl.
*G06N 5/04* (2023.01)
*G11C 11/56* (2006.01)
*G06N 3/06* (2006.01)
*G11C 11/4074* (2006.01)

(52) U.S. Cl.
CPC ...... *G11C 11/2257* (2013.01); *G11C 11/4074* (2013.01); *G11C 11/5642* (2013.01)

(58) Field of Classification Search
USPC .................................................. 365/185.08
See application file for complete search history.

(56) References Cited

U.S. PATENT DOCUMENTS

| | | | |
|---|---|---|---|
| 11,069,391 | B2 | 7/2021 | Lu et al. |
| 2003/0189865 | A1* | 10/2003 | Ausserlechner ... G11C 16/0441 365/200 |
| 2004/0047187 | A1 | 3/2004 | Sakakibara |
| 2004/0100819 | A1 | 5/2004 | Hidaka |
| 2010/0208520 | A1 | 8/2010 | Wang et al. |
| 2014/0138755 | A1 | 5/2014 | Dhaoui et al. |
| 2014/0159770 | A1* | 6/2014 | Shukh ............... G11C 13/0002 326/37 |
| 2014/0340959 | A1 | 11/2014 | Antonyan |
| 2015/0228340 | A1 | 8/2015 | Best |
| 2015/0355846 | A1 | 12/2015 | Uematsu et al. |
| 2016/0203868 | A1 | 7/2016 | Wang |
| 2016/0358661 | A1 | 12/2016 | Vali et al. |

OTHER PUBLICATIONS

PCT International Preliminary Report on Patentability dated Jun. 10, 2021, issued in related International Application No. PCT/US2019/062895 (6 pages).

Non-Final Office Action dated Nov. 30, 2020, issued in related U.S. Appl. No. 16/693,332 (6 pages).

First Search dated Dec. 21, 2021, issued in related Chinese Application No. 201980078991.6 (1 page).

First Office Action dated Dec. 28, 2021, issued in related Chinese Application No. 201980078991.6, with English machine translation (9 pages).

Non-Final Office Action dated May 11, 2022, issued in related U.S. Appl. No. 17/308,675 (8 pages).

* cited by examiner

DUAL-PRECISION ANALOG MEMORY CELL AND ARRAY

CROSS REFERENCE TO RELATED APPLICATIONS

The present application is a continuation of U.S. patent application Ser. No. 17/308,675, filed May 5, 2021, entitled "DUAL-PRECISION ANALOG MEMORY CELL AND ARRAY," which is a continuation of U.S. patent application Ser. No. 16/693,332, filed Nov. 24, 2019, entitled "DUAL-PRECISION ANALOG MEMORY CELL AND ARRAY," now U.S. Pat. No. 11,069,391, which claims priority to U.S. Provisional Patent Application No. 62/773,991, filed Nov. 30, 2018, entitled "DUAL-PRECISION ANALOG MEMORY CELL." The disclosures of all of the above-referenced applications are incorporated by reference herein in their entirety.

TECHNICAL FIELD

The disclosure relates generally to computer technology, and particularly, to memory elements for computer systems.

BACKGROUND

Many different types of memory elements are available for use in modern computer systems, with different performance trade-offs. These memory systems include volatile and nonvolatile memory elements, both of which may be implemented in digital or analog form. The performance trade-offs include power consumption, speed, and duration of storage without power.

SUMMARY

In general, one aspect disclosed features a memory cell, comprising: a non-volatile memory element having an input terminal and at least one output terminal; and a volatile memory element having a plurality of input terminals and an output terminal, wherein the output terminal of the volatile memory element is coupled to the input terminal of the non-volatile memory element, and wherein the volatile memory element comprises: a first transistor coupled between a first supply and a common node, and a second transistor coupled between a second supply and the common node; wherein the common node is coupled to the output terminal of the volatile memory element; and wherein gates of the first and second transistors are coupled to respective ones of the plurality of input terminals of the volatile memory element.

Embodiments of the memory cell may include one or more of the following features. In some embodiments, the first transistor is a P-type metal-oxide-semiconductor (PMOS) transistor; and the second transistor is an N-type metal-oxide-semiconductor (NMOS) transistor. In some embodiments, the non-volatile memory element comprises a floating-gate transistor, wherein a gate of the floating-gate transistor is coupled to the input terminal of the non-volatile memory element, and wherein a source and a drain of the floating-gate transistor are coupled to respective ones of the at least one output terminal of the non-volatile memory element. In some embodiments, the non-volatile memory element comprises a ferro-electric transistor, wherein the ferro-electric transistor comprises a third transistor and a ferroelectric capacitor, wherein the ferroelectric capacitor is coupled between a gate of the third transistor and the input terminal of the non-volatile memory element, and wherein a source and a drain of the third transistor are coupled to respective ones of the at least one output terminal of the non-volatile memory element. In some embodiments, the non-volatile memory element further comprises: a third transistor coupled between the gate of the first transistor and a first word line, wherein a gate of the third transistor is coupled to a first bit line; and a fourth transistor coupled between the gate of the second transistor and a second word line, wherein a gate of the fourth transistor is coupled to a second bit line. In some embodiments, the non-volatile memory element further comprises: a third transistor coupled between a source of the first transistor and the first supply, wherein a gate of the third transistor is coupled to a first word line, and wherein the gate of the first transistor is coupled to a first bit line; and a fourth transistor coupled between a drain of the second transistor and a second supply, wherein a gate of the fourth transistor is coupled to a second word line, and wherein the gate of the second transistor is coupled to a second bit line. In some embodiments, the first transistor is a first split-gate transistor having a first gate and a second gate, wherein the first gate is coupled to a first word line, and wherein the second gate is coupled to a first bit line; and the second transistor is a second split-gate transistor having a third gate and a fourth gate, wherein the third gate is coupled to a second word line, and wherein the fourth gate is coupled to a second bit line.

In general, one aspect disclosed features a memory array, comprising: an array of memory cells, wherein each memory cell comprises: a non-volatile memory element having an input terminal and at least one output terminal; and a volatile memory element having a plurality of input terminals and an output terminal, wherein the output terminal of the volatile memory element is coupled to the input terminal of the non-volatile memory element.

Embodiments of the memory array may include one or more of the following features. In some embodiments, the volatile memory element comprises: a first transistor coupled between a first supply and a common node; and a second transistor coupled between a second supply and the common node; wherein the common node is coupled to the output terminal of the volatile memory element; and wherein gates of the first and second transistors are coupled to respective ones of the plurality of input terminals of the volatile memory element. In some embodiments, the first transistor is a P-type metal-oxide-semiconductor (PMOS) transistor; and the second transistor is an N-type metal-oxide-semiconductor (NMOS) transistor. In some embodiments, the non-volatile memory element comprises a floating-gate transistor, wherein a gate of the floating-gate transistor is coupled to the input terminal of the non-volatile memory element, and wherein a source and a drain of the floating-gate transistor are coupled to respective ones of the at least one output terminal of the non-volatile memory element. In some embodiments, the non-volatile memory element comprises a ferro-electric transistor, wherein the ferro-electric transistor comprises a third transistor and a ferroelectric capacitor, wherein the ferroelectric capacitor is coupled between a gate of the third transistor and the input terminal of the non-volatile memory element, and wherein a source and a drain of the third transistor are coupled to respective ones of the at least one output terminal of the non-volatile memory element. Some embodiments comprise a control circuit configured to apply a first voltage pulse to the gate of the first transistor, and to apply a second voltage pulse to the gate of the second transistor; wherein a charge at the common node increases by a fixed amount responsive to the first voltage pulse; and wherein the charge at the common node decreases by the fixed amount responsive to the second voltage pulse. In some embodiments, the control circuit is further configured to modify a value stored in the non-volatile memory element according to a level of the charge at the common node.

In general, one aspect disclosed features a neural network, comprising: an array of memory cells, wherein each memory cell comprises: a non-volatile memory element having an input terminal and at least one output terminal; and a volatile memory element having a plurality of input terminals and an output terminal, wherein the output terminal of the volatile memory element is coupled to the input terminal of the non-volatile memory element.

Embodiments of the neural network may include one or more of the following features. In some embodiments, the volatile memory element comprises: a first transistor coupled between a first supply and a common node; and a second transistor coupled between a second supply and the common node; wherein the common node is coupled to the output terminal of the volatile memory element; and wherein gates of the first and second transistors are coupled to respective ones of the plurality of input terminals of the volatile memory element. In some embodiments, the first transistor is a P-type metal-oxide-semiconductor (PMOS) transistor; and the second transistor is an N-type metal-oxide-semiconductor (NMOS) transistor. In some embodiments, a control circuit configured to apply a first voltage pulse to the gate of the first transistor, and to apply a second voltage pulse to the gate of the second transistor, during a training phase of the neural network; wherein a charge at the common node increases by a fixed amount responsive to the first voltage pulse; and wherein the charge at the common node decreases by the fixed amount responsive to the second voltage pulse. In some embodiments, the control circuit is further configured to modify a value stored in the non-volatile memory element according to a level of the charge at the common node during an update phase of the neural network. In some embodiments, the control circuit is further configured to read the value stored in the non-volatile memory element during an inference phase of the neural network.

BRIEF DESCRIPTION OF THE DRAWINGS

The accompanying drawings, which constitute a part of this disclosure, illustrate several non-limiting embodiments and, together with the description, serve to explain the disclosed principles.

FIG. 5 illustrates a biasing scheme for increasing a weight stored in a memory cell.

FIG. 6 illustrates a biasing scheme for decreasing a weight stored in a memory cell.

FIG. 7 illustrates a biasing scheme for reading a weight stored in a memory cell.

FIG. 9 illustrates a biasing scheme for setting the non-volatile memory element of the memory cell.

FIG. 10 illustrates a biasing scheme for resetting a non-volatile memory element of a memory cell.

DETAILED DESCRIPTION OF THE EMBODIMENTS

Figure 1:
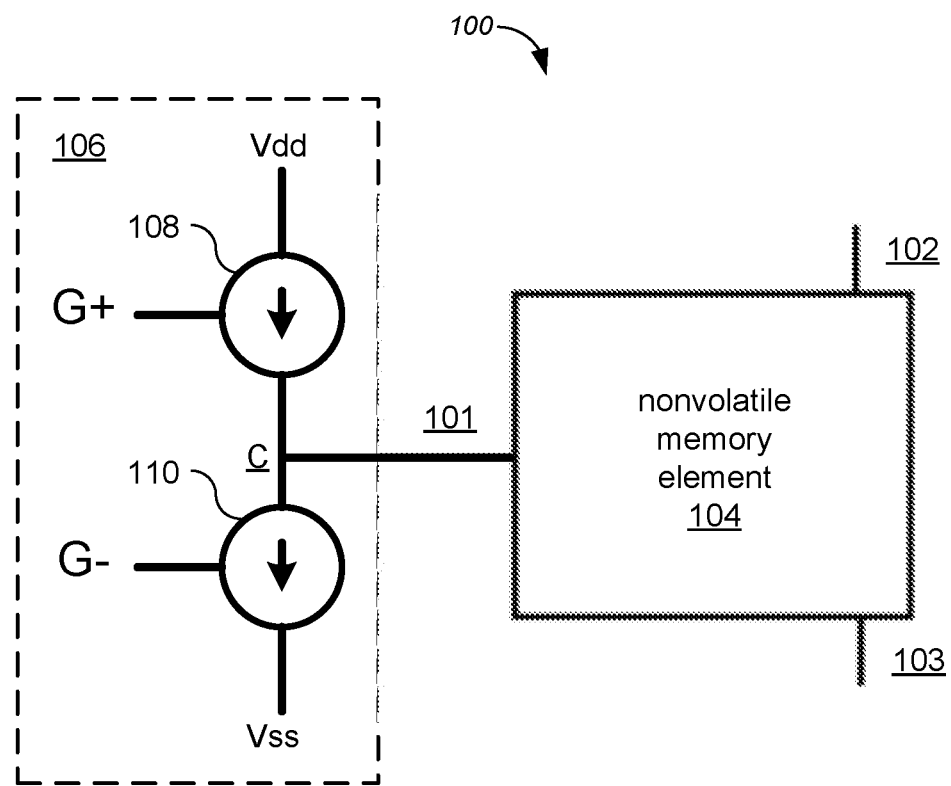
FIG. 1 illustrates a dual precision analog memory cell according to one embodiment.
Figure 1:
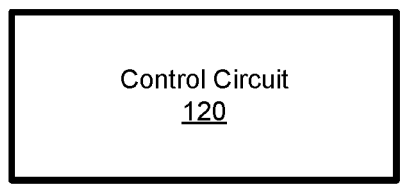

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention.

Some current computer technologies include multiple phases, with different levels of memory precision required for different phases. One such technology is neural networks, which include training phases and inference phases. During neural network training phases, high precision is desired to accumulate small changes to the weights of the neural network. But during inference phases, lower bit precision can be tolerated without sacrificing accuracy. For example, with deep neural networks, a relatively higher precision (for example, using a relatively large number of bits) is needed during training to accumulate incremental weight changes. But during inference phases, a relatively lower precision (for example, using a relatively low number of bits) is sufficient to achieve the desired accuracy.

Continuing with the example of neural networks, the use of analog multilevel nonvolatile memory elements is increasingly popular, for example due to their high speed and low power consumption. But analog nonvolatile memory elements suffer from several drawbacks. For example, the number of bits that can be controlled by an analog nonvolatile memory element is limited. Among current commercially available analog nonvolatile memory elements, the highest precision available is 4 bits, for example. And because these solutions are standalone storage products requiring heavy error correction, they are unsuitable for neural network applications.

Furthermore, these analog nonvolatile memory elements suffer from unacceptable accuracy degradation resulting from factors such as limited dynamic range, variation, and most importantly asymmetric and nonlinear weight updates.

As such, these analog nonvolatile memory elements are so far unsuitable for neural network applications.

The disclosed embodiments provide dual-precision analog memory cells. These memory cells include a high precision volatile memory element coupled with a low precision nonvolatile memory element. These memory cells are ideal for applications such as neural networks. However, these memory cells are not limited to use in neural networks, and may be used in other computer technologies as well.

Returning to the neural network example, during training phases, the volatile memory element accumulates high precision data, using a relatively high number of bits. After each training phase, the high precision data accumulated in the volatile memory element may be transferred to the nonvolatile memory element. During neural network inference phases the data stored in the nonvolatile memory element may be read.

FIG. 1 illustrates a dual precision analog memory cell 100 according to one embodiment. Referring to FIG. 1, the dual precision analog memory cell 100 includes a nonvolatile memory element 104 and a volatile memory element 106. The nonvolatile memory element 104 includes an input terminal 101, and output terminals 102 and 103, but may include more terminals, for example to support other functions. The volatile memory element 106 includes two voltage-controlled current sources 108, 110. The output of one voltage-controlled current source 108, and the input of the other voltage-controlled current source 110, are coupled together at a common node C, which serves as an output terminal of the nonvolatile memory element 104, and is coupled to the input terminal 101 of the nonvolatile memory element 104. Various embodiments may also include one or more control circuits 120 to control one or more of the memory cells disclosed herein.

The current generated by each voltage-controlled current source 108, 110 is a function of the voltage applied to the control terminal of the current source. For example, referring to FIG. 1, the current generated by voltage-controlled current source 108 is a function of the voltage G+ (for example, the function may be f+=Vdd−G+), and the current generated by voltage-controlled current source 110 is a function of the voltage G− (for example, the function may be f−=G−−Vss). In one example, the current generated by each voltage-controlled current source 108, 110 is proportional to the voltage applied to the control terminal. Many devices are suitable for implementing the voltage-controlled current sources 108, 110. In some embodiments, the voltage-controlled current sources 108, 110 are implemented using complementary metal oxide semiconductor technology (CMOS) transistors.

Figure 2:
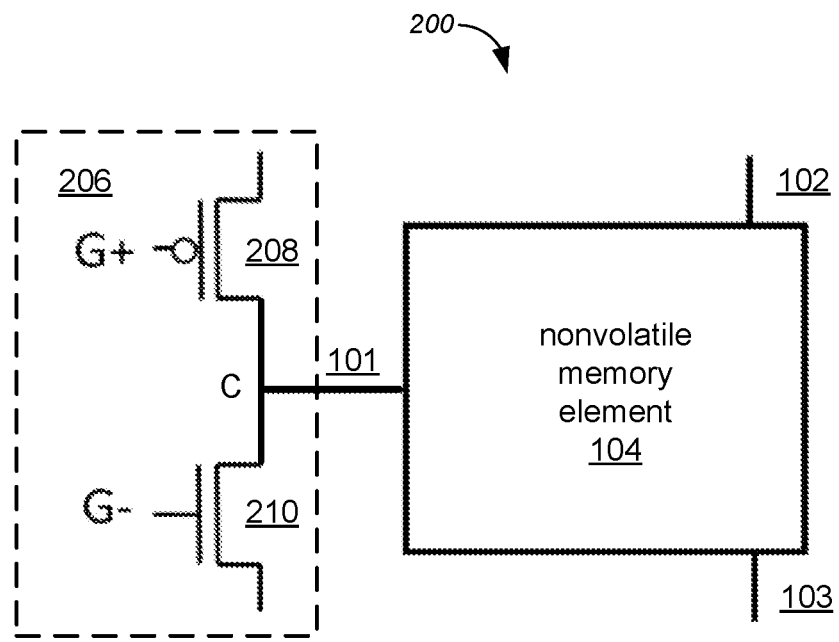
FIG. 2 illustrates a dual precision analog memory cell using CMOS transistors according to one embodiment.

FIG. 2 illustrates a dual precision analog memory cell 200 using CMOS transistors according to one embodiment. Referring to FIG. 2, the dual precision analog memory cell 200 includes a nonvolatile memory element 104 and a volatile memory element 206. The nonvolatile memory element 104 includes an input terminal 101, and output terminals 102 and 103. The volatile memory element 206 includes a pull-up transistor 208 and a pull-down transistor 210. In the example of FIG. 2, the pull-up transistor 208 is implemented as a P-type metal-oxide-semiconductor (PMOS) transistor, and the pull-down transistor 210 is implemented as an N-type metal-oxide-semiconductor (NMOS) transistor. The drain of the PMOS pull-up transistor 208, and the source of the NMOS pull-down transistor 210, are coupled together at a common node C, which is coupled to the input terminal 101 of the nonvolatile memory element 104.

In the described embodiments, the pull-up transistor 208, and the pull-down transistor 210, are implemented using complementary metal oxide semiconductor technology (CMOS). However, other technologies may be used. For example, the pull-up transistor 208, and the pull-down transistor 210, may be implemented as tunnel field-effect transistors (TFET) or the like. Compared with CMOS, the use of TFET allows the potential to achieve even lower leakage currents and better retention for the volatile memory element 206.

It is possible to replace the combination of the pull-up transistor 208, and the pull-down transistor 210, with a single transistor. But by balancing the leakage currents of the pull-up transistor 208, and the pull-down transistor 210, the charge stored in the common node C can be kept for a much longer time compared to a single-transistor structure. When the disclosed dual precision analog memory cells are used in neural networks, this greatly increased retention time allows a longer duration for each training cycle, resulting in greater accuracy.

According to various embodiments, the nonvolatile memory element 104 satisfies three requirements. First, the voltage at the input terminal 101 can modulate the current and/or conductance between terminal 102 and terminal 103. Second, the nonvolatile memory element 104 includes a nonvolatile memory element that can be programmed to multiple states based on the voltage at the input terminal 101. Third, the nonvolatile memory element can be modified by applying a voltage between input terminal 101 and terminal 102, or between input terminal 101 and terminal 103. Example nonvolatile memory elements 104 that satisfy these three requirements include floating-gate transistors and ferro-electric transistors. But other devices that satisfy these three requirements may be used.

Figure 3:
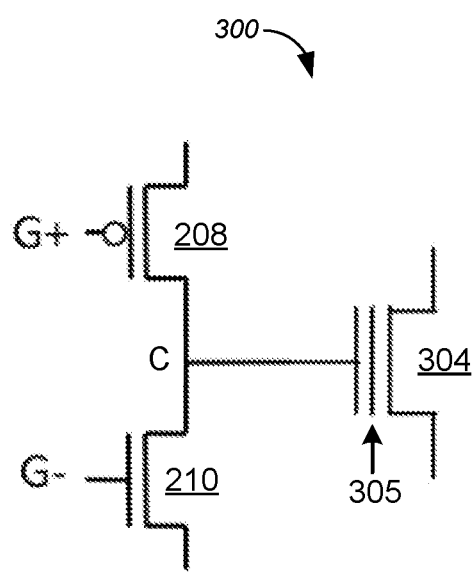
FIG. 3 illustrates an analog dual precision memory cell that includes a floating gate transistor.

FIG. 3 illustrates an analog dual precision memory cell 300 that includes a floating gate transistor 304 having a floating gate 305. The floating gate transistor 304 may be implemented using CMOS, TFET, or the like. Referring to FIG. 3, the drain of the PMOS pull-up transistor 208, and the source of the NMOS pull-down transistor 210, are coupled together at a common node C, and to the floating gate 305 of the floating gate transistor 304.

Figure 4:
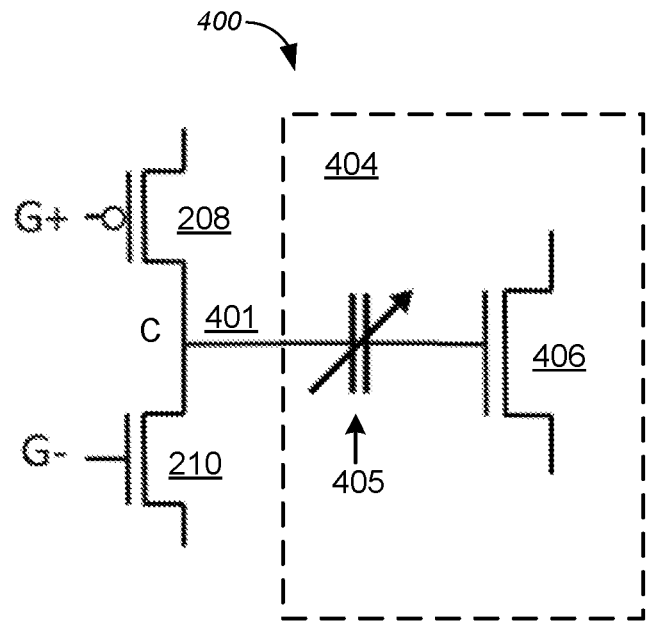
FIG. 4 illustrates an analog dual precision memory cell that includes a ferro-electric transistor.

FIG. 4 illustrates an analog dual precision memory cell 400 that includes a ferro-electric transistor 404 having an input terminal 401. Referring to FIG. 4, the ferro-electric transistor 404 includes a transistor 406, and a ferroelectric capacitor 405 coupled between the input terminal 401 and the transistor 406. The drain of the PMOS pull-up transistor 208, and the source of the NMOS pull-down transistor 210, are coupled together at a common node C, and to the input terminal 401 of the ferro-electric transistor 404.

Referring again to FIG. 2, operation of the analog dual precision memory cell 200 is now described in the context of neural networks. The value stored in memory cell 200, also referred to herein as a neural network weight, is represented by a combination of lower bits and upper bits. The lower bits are represented by the charge between the pull-up transistor 208 and the pull-down transistor 210. This charge can change continuously during neural network training, and represents a relatively high number of bits. Each time the pull-up transistor 208 is turned on, the common node C is charged by a fixed amount q. Each time the pull-down transistor 210 is turned on, the common node C is discharged by the fixed amount q. These operations allow multi-bit storage and continuous tuning. The upper bits are represented by the state of the nonvolatile memory element 104, using a relatively low number of bits.

In neural networks, the training process is divided into multiple training phases separated by update phases. For example, each training phase may last for 1-10 ms. During each training phase, training data are fed into the neural network, and thereby modify the weights stored in the volatile element 206 of the memory cell 200. During each update phase, the accumulated charge in the volatile memory element 206 is read out, and if the charge exceeds certain thresholds, the value represented by the charge is carried over to the upper bits by programming the nonvolatile memory element 104. After reading, the value of the volatile memory element 206 is restored to a neutral level. For example, the charge at the common node C is restored to a charge in the middle of the range of possible charges. In this way, the disclosed dual precision analog memory elements may be used to transition seamlessly between training and inference phases for neural networks.

After the neural network training process is completed, an inference process may be executed. During the inference process, only the upper bits are required. The lower bits, represented by the charge at the common node C of the volatile memory element 206, may be ignored without sacrificing the accuracy of the inference. Because the volatile memory element 206 requires far less power than a nonvolatile memory element, the trained results may be saved using far less power than a solution employing nonvolatile memory elements only.

Figure 5:
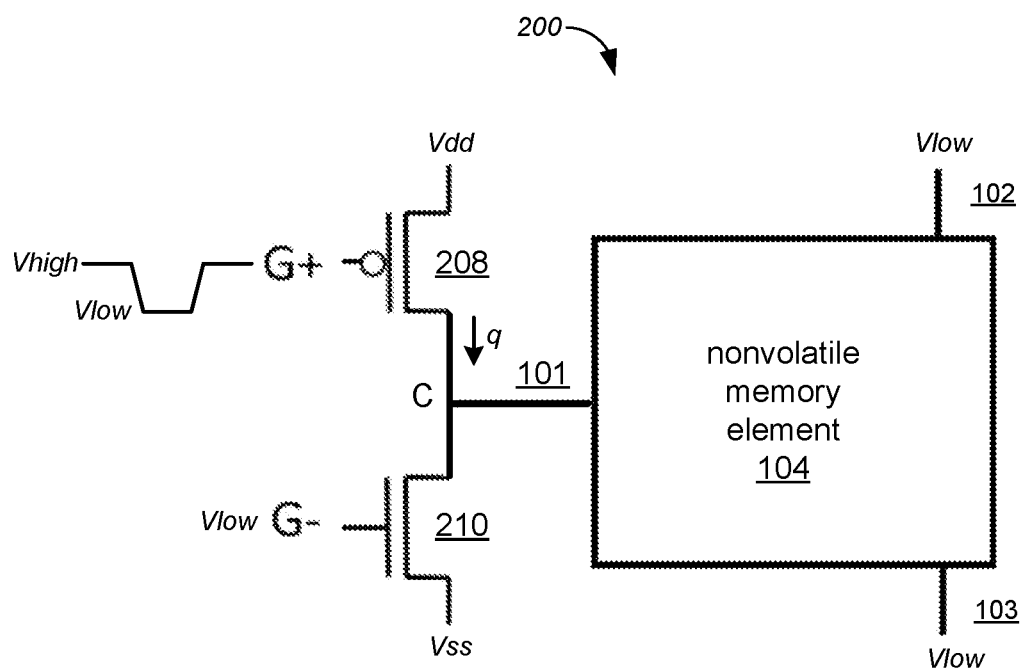
FIGS. 5-7 illustrate biasing schemes for a neural network training phase for the dual precision analog memory cell of FIG. 2.
Figure 6:
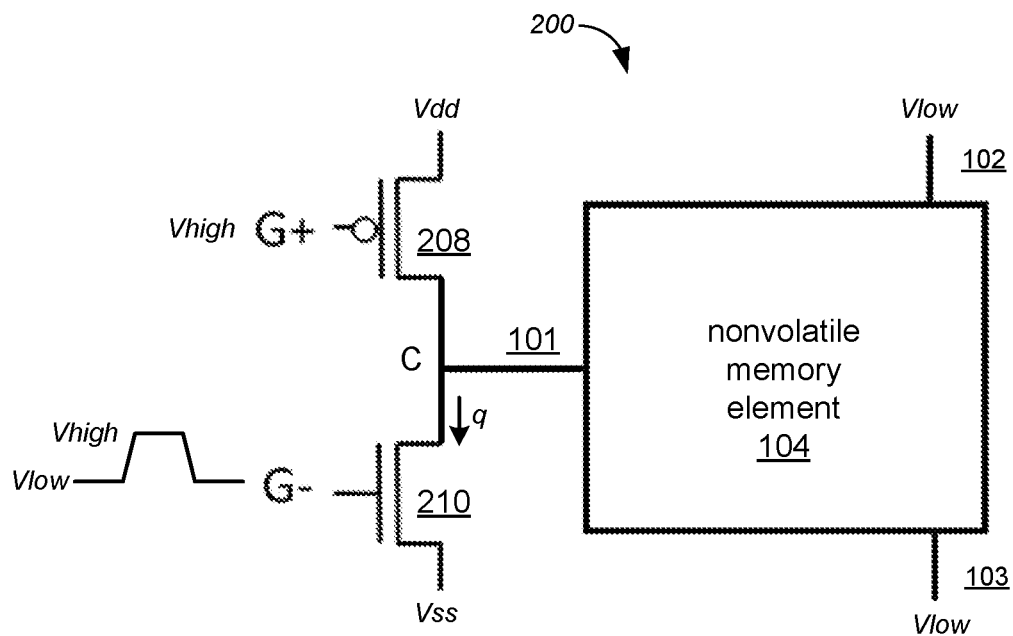

FIGS. 5-6 illustrate biasing schemes for a neural network training phase for the dual precision analog memory cell 200 of FIG. 2. FIG. 5 illustrates a biasing scheme for increasing the weight stored in the dual precision analog memory cell 200 of FIG. 2. Referring to FIG. 5, the source of the pull-up transistor 208 is biased at Vdd, and the drain of the pull-down transistor 210 is biased at Vss. The output terminals 102 and 103 of the nonvolatile memory element 104, and the input terminal G− of the pull-down transistor 210, are biased at a relatively low voltage Vlow. With this biasing, and by applying a voltage pulse Vlow at the input terminal G+ of the pull-up transistor 208, the common node C is charged by a fixed charge q, as shown in FIG. 5.

FIG. 6 illustrates a biasing scheme for decreasing the weight stored in the dual precision analog memory cell 200 of FIG. 2. Referring to FIG. 6, the source of the pull-up transistor 208 is biased at Vdd, and the drain of the pull-down transistor 210 is biased at Vss. The output terminals 102 and 103 of the nonvolatile memory element 104 are biased at Vlow. The input terminal G+ of the pull-up transistor 208 is biased at a relatively high voltage Vhigh. With this biasing, and by applying a voltage pulse Vhigh at the input terminal G− of the pull-down transistor 210, the common node C is discharged by a fixed charge q, as shown in FIG. 6.

Figure 7:
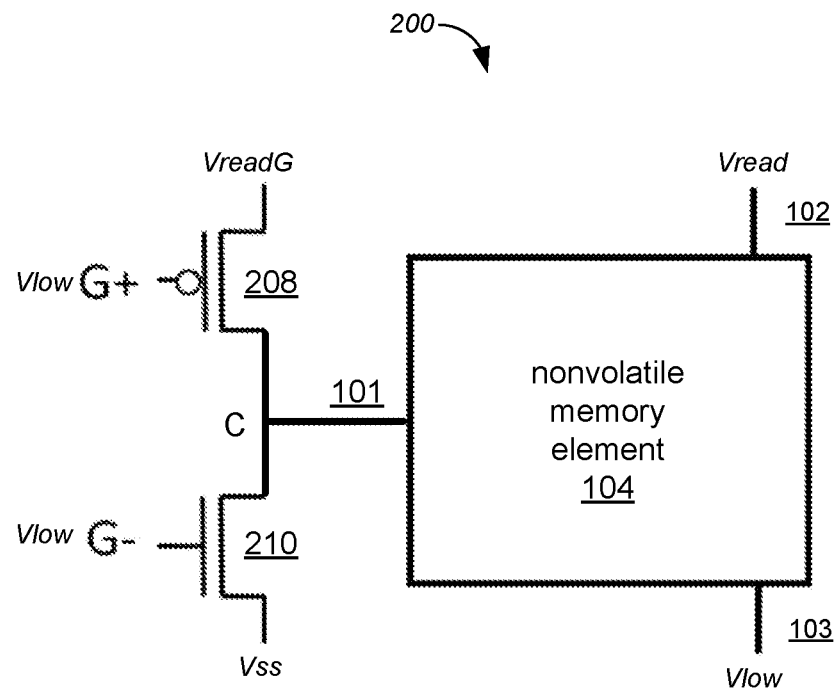

FIG. 7 illustrates a biasing scheme for reading the weight stored in the dual precision analog memory cell 200 of FIG. 2. Referring to FIG. 7, the source of the pull-up transistor 208 is biased at VreadG, and the drain of the pull-down transistor 210 is biased at Vss. The input terminal G+ of the pull-up transistor 208, and the input terminal G− of the pull-down transistor 210, are biased at Vlow. With this biasing, the weight stored in the memory cell 200 may be read by applying voltages Vread and Vlow at the output terminals 102 and 103, respectively, of the nonvolatile memory element 104, as shown in FIG. 7, or alternatively by applying voltages Vread and Vlow at the output terminals 103 and 102, respectively, of the nonvolatile memory element 104. In either case, the weight stored in the memory cell 200 may be read by reading the current flowing between the output terminals 103 and 102.

Figure 8:
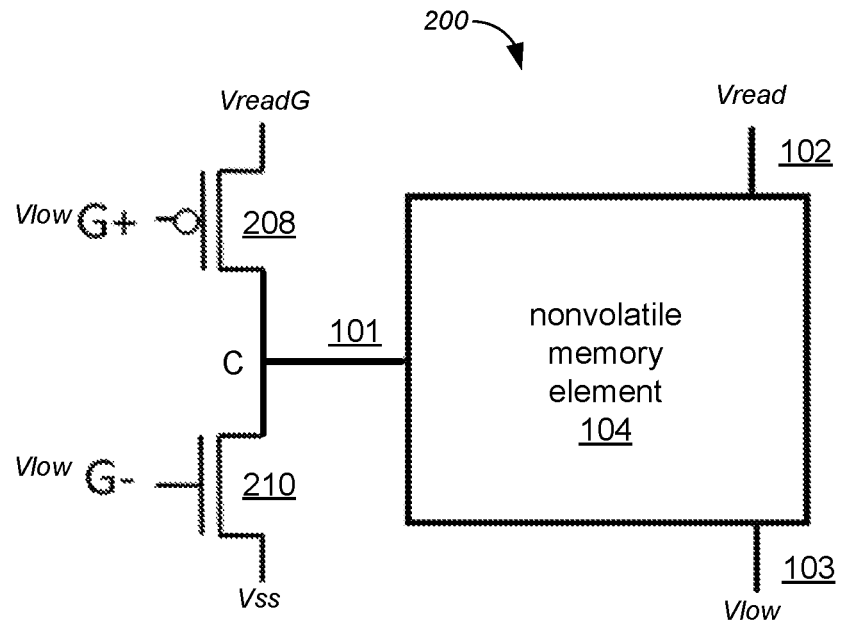
FIGS. 8-10 illustrate biasing schemes for a neural network update phase for the dual precision analog memory cell of FIG. 2.
Figure 9:
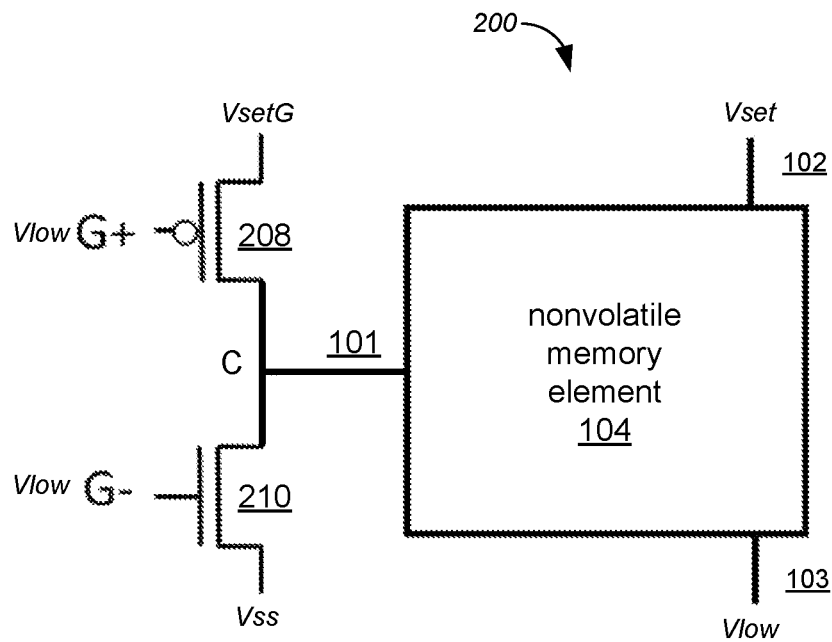
Figure 10:
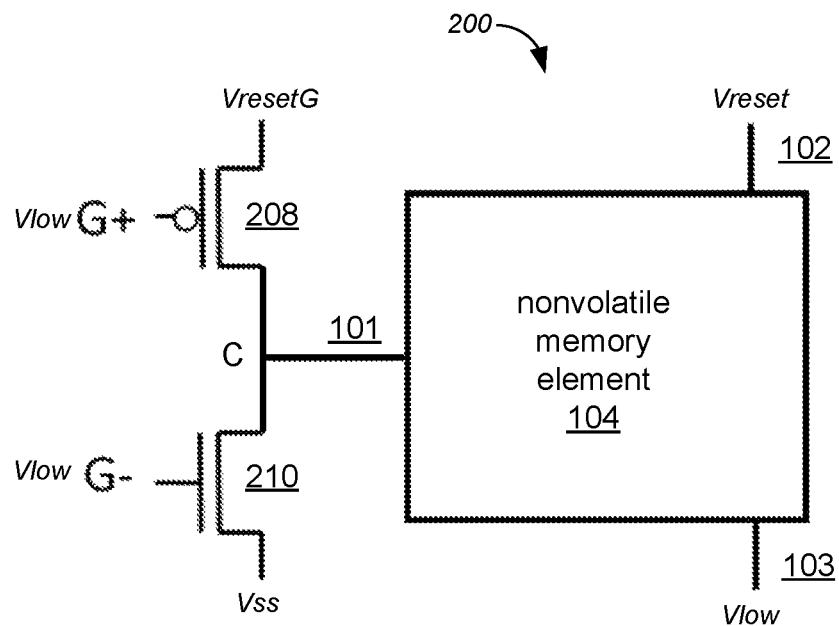

FIGS. 8-10 illustrate biasing schemes for a neural network update phase for the dual precision analog memory cell 200 of FIG. 2. FIG. 8 illustrates a biasing scheme for reading the weight stored in the dual precision analog memory cell 200 of FIG. 2. Referring to FIG. 8, the drain of the pull-down transistor 210 is biased at Vss. The input terminal G+ of the pull-up transistor 208, and the input terminal G− of the pull-down transistor 210, are biased at Vlow. The source of the pull-up transistor 208 is biased at a voltage VreadG. With this biasing, the weight stored in the memory cell 200 may be read by applying voltages Vread and Vlow at the output terminals 102 and 103, respectively, of the nonvolatile memory element 104, as shown in FIG. 8, or alternatively by applying voltages Vread and Vlow at the output terminals 103 and 102, respectively, of the nonvolatile memory element 104. In either case, the weight stored in the memory cell 200 may be read by reading the current flowing between the output terminals 103 and 102.

FIG. 9 illustrates a biasing scheme for setting the nonvolatile memory element 104 of the dual precision analog memory cell 200 of FIG. 2. Referring to FIG. 9, the drain of the pull-down transistor 210 is biased at Vss. The input terminal G+ of the pull-up transistor 208, and the input terminal G− of the pull-down transistor 210, are biased at Vlow. The source of the pull-up transistor 208 is biased at a voltage VsetG. With this biasing, the nonvolatile memory element 104 of the memory cell 200 may be set by applying voltages Vset and Vlow at the output terminals 102 and 103, respectively, of the nonvolatile memory element 104, as shown in FIG. 9, or alternatively by applying voltages Vset and Vlow at the output terminals 103 and 102, respectively, of the nonvolatile memory element 104. In response, the nonvolatile memory element 104 of the memory cell 200 is set to a level that conducts more current between the output terminals 102 and 103.

FIG. 10 illustrates a biasing scheme for resetting the nonvolatile memory element 104 of the dual precision analog memory cell 200 of FIG. 2. Referring to FIG. 10, the drain of the pull-down transistor 210 is biased at Vss. The input terminal G+ of the pull-up transistor 208, and the input terminal G− of the pull-down transistor 210, are biased at Vlow. The source of the pull-up transistor 208 is biased at a voltage VresetG. With this biasing, the nonvolatile memory element 104 of the memory cell 200 may be reset by applying voltages Vreset and Vlow at the output terminals 102 and 103, respectively, of the nonvolatile memory element 104, as shown in FIG. 10, or alternatively by applying voltages Vreset and Vlow at the output terminals 103 and 102, respectively, of the nonvolatile memory element 104. In response, the nonvolatile memory element 104 of the memory cell 200 is reset to a level that conducts less current between the output terminals 102 and 103.

Figure 11:
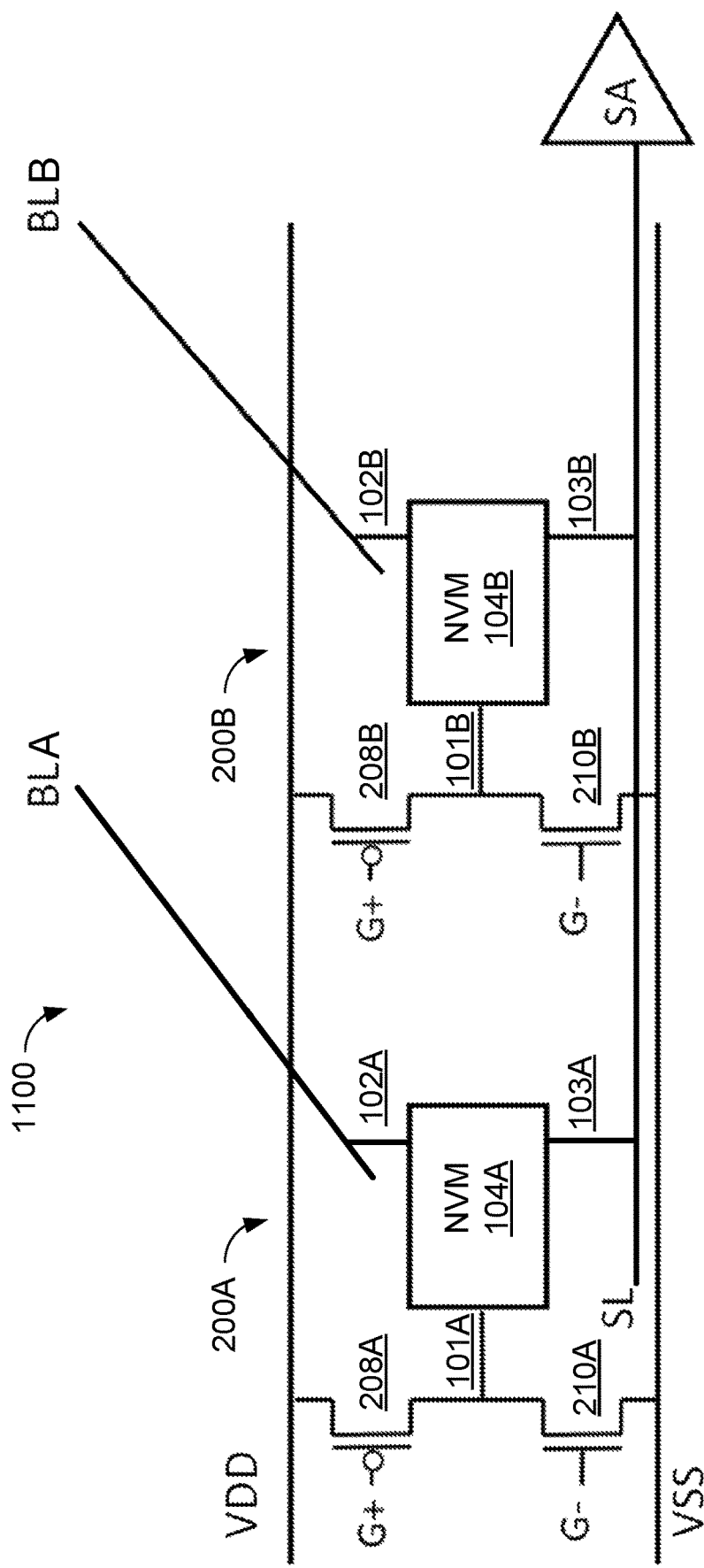
FIG. 11 shows one implementation of an array of dual precision nonvolatile memory cells according to one embodiment.

FIG. 11 shows one implementation of an array 1100 of the dual precision nonvolatile memory cells 200 of FIG. 2 according to one embodiment. Referring to FIG. 11, the array 1100 includes two dual precision memory cells 200A, B. The dual precision memory cell 200A includes a pull-up transistor 208A, a pull-down transistor 210A, and a nonvolatile memory element (NVM) 104A having terminals 101A, 102A, and 103B. The dual precision memory cell 200B includes a pull-up transistor 208B, a pull-down transistor 210B, and a nonvolatile memory element (NVM) 104B having terminals 101B, 102B, and 103B.

The output terminals 102A,B of the memory cells 200A,B are coupled to respective bit lines BLA,BLB, and the output terminals 103A,B of the memory cells 200A,B are coupled to a common source line SL, which is coupled to a sense amplifier SA. If the gates G+ of the pull-up transistors 208A,B are coupled to the same word line, or if the gates G− of the pull-down transistors 210A,B are coupled to the same word line, the weights of the lower bits of the memory cells 200A,B will always be updated together. In some embodiments, it may be desirable to update the pull-up transistors 208A,B (or the pull-down transistors 210A,B) independently.

Figure 12:
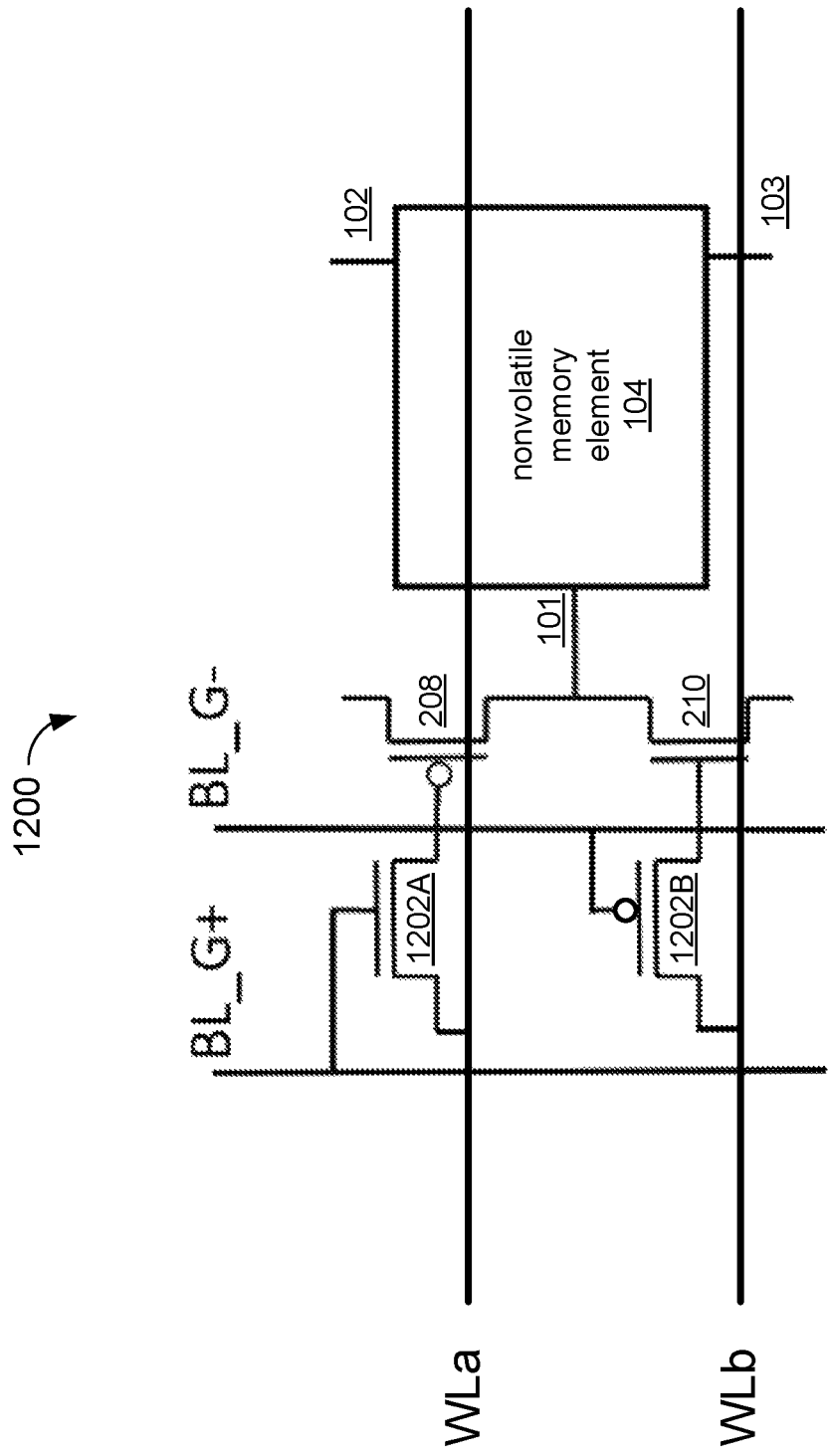
FIG. 12 shows an implementation of a dual precision nonvolatile memory cell using gate biasing transistors to allow independent updates of volatile memory elements in an array according to one embodiment.

FIG. 12 shows an implementation of a dual precision nonvolatile memory cell 1200 using gate biasing transistors to allow independent updates of volatile memory elements 206 in an array of the dual precision nonvolatile memory cells 200 of FIG. 2 according to one embodiment. Referring to FIG. 12, each transistor 208, 210 is independently biased by a transistor 1202A,B, respectively. In particular, the gate of NMOS transistor 1202A is biased by a signal BL_G+, while the gate of PMOS transistor 1202B is biased by a signal BL_G−. And transistor 1202A is coupled between the gate of the pull-up transistor 208 and a word line signal WLa, while transistor 1202B is coupled between the gate of the pull-down transistor 210 and a word line signal WLb. This approach requires the addition of at least two transistors 1202 to each memory cell 1200.

Figure 13:
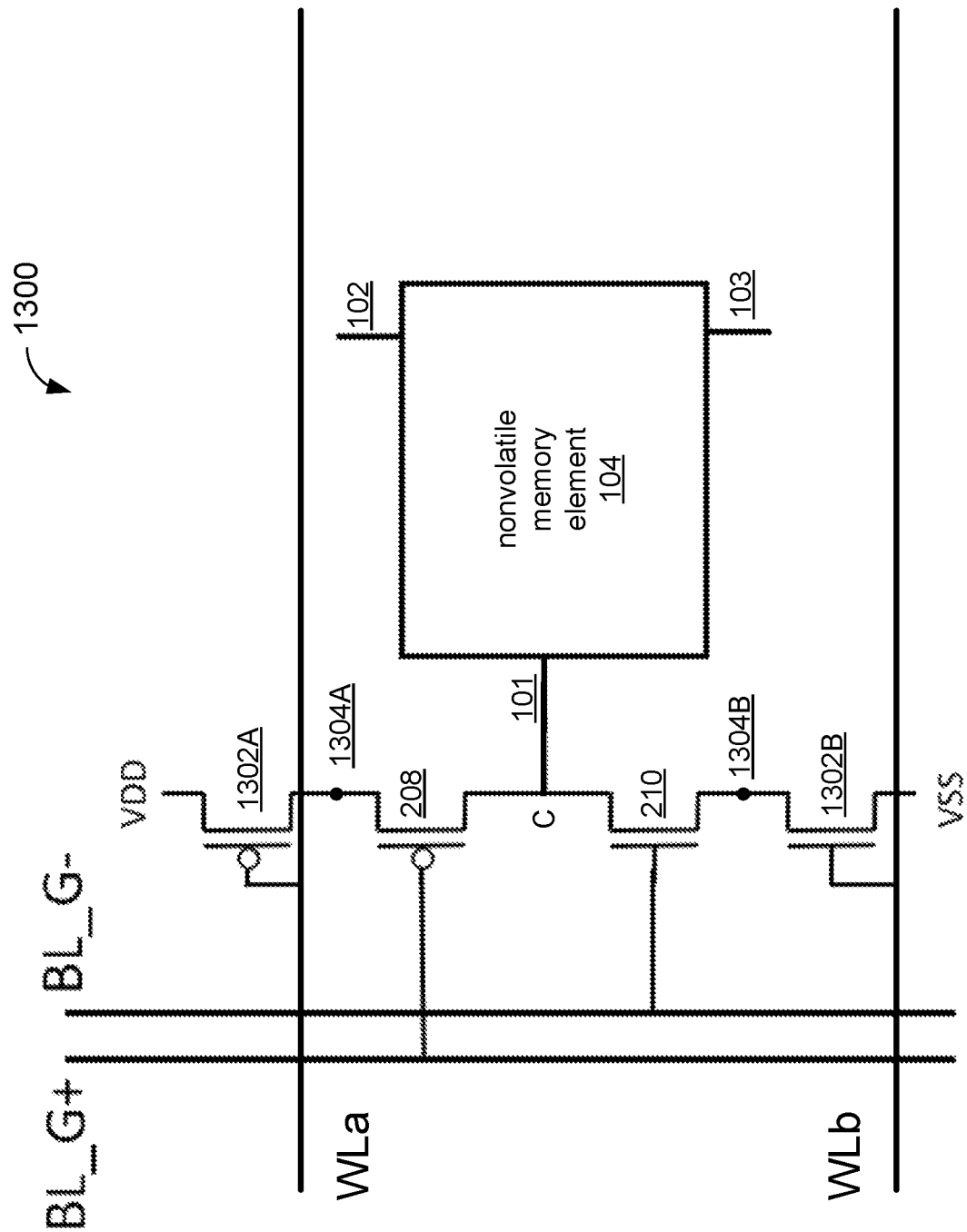
FIG. 13 shows an implementation of a dual precision nonvolatile memory cell using cascade transistors to allow independent updates of volatile memory elements in an array according to one embodiment.

FIG. 13 shows an implementation of a dual precision nonvolatile memory cell 1300 using cascade transistors to allow independent updates of volatile memory elements 206 in an array of the dual precision nonvolatile memory cells 200 of FIG. 2 according to one embodiment. Referring to FIG. 13, cascade transistors 1302A,B are added to transistors 208,210, respectively. In particular, the cascade transistor 1302A is coupled between the source of the pull-up transistor 208 and the supply Vdd, with the gate of the cascade transistor 1302A coupled to word line WLa. The gate of the pull-up transistor 208 is coupled to signal BL_G+. The cascade transistor 1302B is coupled between the drain of the pull-down transistor 210 and the supply Vss, with the gate of the cascade transistor 1302B coupled to word line WLb. The gate of the pull-down transistor 210 is coupled to signal BL_G−. The cascade transistors 1302A,B may be implemented using CMOS, TFET, or the like. In the illustrated embodiment, charges are shared by transistors 208 and 1302A at node 1304A, and by transistors 210 and 1302B at node 1304B.

Figure 14:
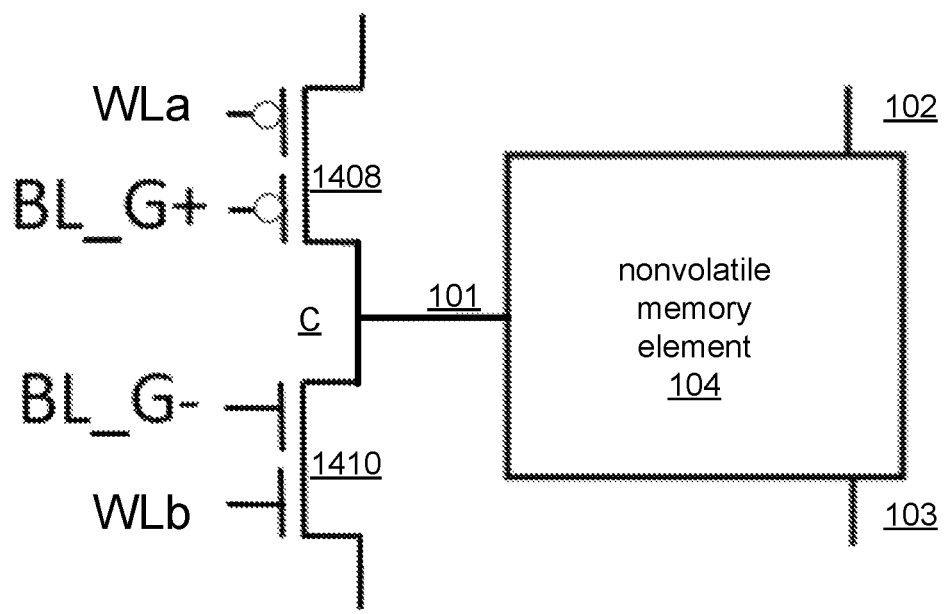
FIG. 14 shows an implementation of a dual precision nonvolatile memory cell using split-gate transistors to allow independent updates of volatile memory elements in an array according to one embodiment.

One implementation resolves this charge-sharing problem using split-gate transistors. FIG. 14 shows an implementation of a dual precision nonvolatile memory cell 1400 using split-gate transistors to allow independent updates of volatile memory elements 206 in an array according to one embodiment. Split-gate transistors are described in Shur, M., "Split-gate field-effect transistor," Applied Physics Letters, 54(2), 162-164 (1989). Compared with the dual precision analog memory cell of FIG. 2, the PMOS pull-up transistor 208 of FIG. 2 is replaced by a split-gate PMOS transistor 1408, while the NMOS pull-down transistor 210 of FIG. 2 is replaced by a split-gate NMOS transistor 1410. Alternatively, the split-gate transistors 1408,1410 may be implemented using TFET, or the like. The gates of the pull-up split-gate transistor 1408 are coupled to word line WLa and signal BL_G+, respectively, while the gates of the pull-down split-gate transistor 1410 are coupled to word line WLb and signal BL_G−, respectively. The use of the split-gate transistors 1408,1410 eliminates the charge-sharing nodes 1304A,B of the dual precision nonvolatile memory cell 1300 of FIG. 13, while allowing independent updates of the volatile memory elements 206 in an array.

While examples and features of disclosed principles are described herein, modifications, adaptations, and other implementations are possible without departing from the spirit and scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

It will be appreciated that the present invention is not limited to the exact construction that has been described above and illustrated in the accompanying drawings, and that various modifications and changes can be made without departing from the scope thereof.

What is claimed is:

1. An apparatus comprising:
   a dual-precision analog memory cell comprising:
   a non-volatile memory element having an input terminal, a first output terminal, and a second output terminal,
   a volatile memory element comprising:
   a first transistor having a drain electrically coupled to the input terminal of the non-volatile memory element, and
   a second transistor having a source electrically coupled to the input terminal of the non-volatile memory element; and
   a controller configured to read a weight stored in the dual precision analog memory cell by:
   biasing a source of the first transistor to a read voltage,
   biasing a drain of the second transistor to a low supply voltage,
   biasing a gate of the first transistor at a low voltage,
   biasing a gate of the second transistor at the low voltage, and
   biasing the first output terminal of the non-volatile memory element at the read voltage and the second output terminal of the non-volatile memory element at the low voltage, wherein the read voltage is higher than the low voltage.

2. The apparatus of claim 1, wherein the controller is further configured to:
   reading a current flowing between the first output terminal of the non-volatile memory element and the second output terminal of the non-volatile memory element.

3. The apparatus of claim 1, wherein:
   the non-volatile memory element comprises a floating-gate transistor, wherein a gate of the floating-gate transistor is coupled to the input terminal of the non-volatile memory element, and wherein a source and a drain of the floating-gate transistor are coupled to respective ones of the first and second output terminals of the non-volatile memory element.

4. The apparatus of claim 1, wherein:
   the non-volatile memory element comprises a ferro-electric transistor, wherein the ferro-electric transistor comprises a third transistor and a ferroelectric capacitor, wherein the ferroelectric capacitor is coupled between a gate of the third transistor and the input terminal of the non-volatile memory element, and wherein a source and a drain of the third transistor are coupled to respective ones of the first and second terminals of the non-volatile memory element.

5. The apparatus of claim 1, wherein the non-volatile memory element further comprises:

a third transistor coupled between the gate of the first transistor and a first word line, wherein a gate of the third transistor is coupled to a first bit line; and a fourth transistor coupled between the gate of the second transistor and a second word line, wherein a gate of the fourth transistor is coupled to a second bit line.

6. The apparatus of claim 1, wherein:

the first transistor is a first split-gate transistor having a first gate and a second gate, wherein the first gate is coupled to a first word line, and wherein the second gate is coupled to a first bit line; and the second transistor is a second split-gate transistor having a third gate and a fourth gate, wherein the third gate is coupled to a second word line, and wherein the fourth gate is coupled to a second bit line.

7. A method for reading a weight stored in a dual precision analog memory cell wherein:

the memory cell comprises:

a dual-precision analog memory cell comprising a non-volatile memory element having an input terminal, a first output terminal, and a second output terminal, a volatile memory element comprising a first transistor having a drain electrically coupled to the input terminal of the non-volatile memory element, and a second transistor having a source electrically coupled to the input terminal of the non-volatile memory element; and the method comprises:

biasing a source of the first transistor to a read voltage, biasing a drain of the second transistor to a low supply voltage, biasing a gate of the first transistor at a low voltage, biasing a gate of the second transistor at the low voltage, and biasing the first output terminal of the non-volatile memory element at the read voltage and the second output terminal of the non-volatile memory element at the low voltage, wherein the read voltage is higher than the low voltage.

8. The method of claim 7, further comprising:

reading a current flowing between the first output terminal of the non-volatile memory element and the second output terminal of the non-volatile memory element.

9. The method of claim 7, wherein:

the non-volatile memory element comprises a floating-gate transistor, wherein a gate of the floating-gate transistor is coupled to the input terminal of the non-volatile memory element, and wherein a source and a drain of the floating-gate transistor are coupled to respective ones of the first and second output terminals of the non-volatile memory element.

10. The method of claim 7, wherein:

the non-volatile memory element comprises a ferro-electric transistor, wherein the ferro-electric transistor comprises a third transistor and a ferroelectric capacitor, wherein the ferroelectric capacitor is coupled between a gate of the third transistor and the input terminal of the non-volatile memory element, and wherein a source and a drain of the third transistor are coupled to respective ones of the first and second terminals of the non-volatile memory element.

11. The method of claim 7, wherein the non-volatile memory element further comprises:

a third transistor coupled between the gate of the first transistor and a first word line, wherein a gate of the third transistor is coupled to a first bit line; and a fourth transistor coupled between the gate of the second transistor and a second word line, wherein a gate of the fourth transistor is coupled to a second bit line.

12. The method of claim 7, wherein:

the first transistor is a first split-gate transistor having a first gate and a second gate, wherein the first gate is coupled to a first word line, and wherein the second gate is coupled to a first bit line; and the second transistor is a second split-gate transistor having a third gate and a fourth gate, wherein the third gate is coupled to a second word line, and wherein the fourth gate is coupled to a second bit line.

\* \* \* \* \*